(12) United States Patent
Dimitrov et al.

(10) Patent No.: US 8,987,038 B2
(45) Date of Patent: Mar. 24, 2015

(54) METHOD FOR FORMING SOLAR CELL WITH SELECTIVE EMITTERS

(75) Inventors: Dimitre Zahariev Dimitrov, Hsinchu (TW); Ching-Hsi Lin, Hsinchu (TW); Chung-Wen Lan, New Taipei (TW); Der-Chin Wu, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 943 days.

(21) Appl. No.: 13/165,670

(22) Filed: Jun. 21, 2011

(65) Prior Publication Data

US 2012/0090673 A1  Apr. 19, 2012

(30) Foreign Application Priority Data

Oct. 19, 2010  (TW) .............................. 99135511 A

(51) Int. Cl.
*H01L 31/0236* (2006.01)
*H01L 31/068* (2012.01)
*H01L 31/18* (2006.01)

(52) U.S. Cl.
CPC ........ *H01L 31/02363* (2013.01); *H01L 31/068* (2013.01); *H01L 31/1804* (2013.01); *Y02E 10/52* (2013.01); *Y02E 10/547* (2013.01)
USPC ............. 438/71; 136/250; 136/258; 136/261; 136/262; 438/98

(58) Field of Classification Search
USPC ................................ 136/258–265; 438/71, 72
See application file for complete search history.

(56) References Cited

U.S. PATENT DOCUMENTS

| | | | |
|---|---|---|---|
| 5,665,175 A * | 9/1997 | Safir | 136/255 |
| 5,704,992 A | 1/1998 | Willeke et al. | |
| 5,726,065 A | 3/1998 | Szlufcik et al. | |
| 5,871,591 A | 2/1999 | Ruby et al. | |
| 6,091,021 A | 7/2000 | Ruby et al. | |
| 6,147,297 A | 11/2000 | Wettling et al. | |

(Continued)

FOREIGN PATENT DOCUMENTS

| | | |
|---|---|---|
| EP | 1843389 A1 | 10/2007 |
| JP | 3272682 | 4/2002 |

(Continued)

OTHER PUBLICATIONS

Taiwan Patent Office, Notice of Allowance, Patent Application Serial No. 099135511, Feb. 13, 2014, Taiwan.

(Continued)

*Primary Examiner* — Jayne Mershon

(57) ABSTRACT

A method for forming a solar cell with selective emitters is disclosed, including selectively removing a portion of a barrier layer on a substrate to form an opening, performing a texture etching process to the substrate to form a second texture structure in a second region under the opening of the barrier layer, wherein the substrate surface in the first region does not change from the first texture structure. The first texture structure and the second texture structure include a plurality of protruding portions and recessing portions. The distance between neighboring protruding portions of the first texture structure is $L_1$, the distance between neighboring protruding portions of the second texture structure is $L_2$, and $L_1$ is 2~20 times that of $L_2$. The method for forming a solar cell with selective emitters further comprises removing the barrier layer and performing a doping process.

8 Claims, 12 Drawing Sheets

(56) References Cited

U.S. PATENT DOCUMENTS

| | | |
|---|---|---|
| 6,429,037 B1 | 8/2002 | Wenham et al. |
| 6,552,414 B1 | 4/2003 | Horzel et al. |
| 6,756,290 B1 | 6/2004 | Bultman |
| 6,757,290 B1 | 6/2004 | Kalmanek, Jr. et al. |
| 6,825,104 B2 | 11/2004 | Horzel et al. |
| 7,129,109 B2 | 10/2006 | Munzer et al. |
| 2006/0078829 A1* | 4/2006 | Toyota et al. ............... 430/315 |
| 2008/0264477 A1* | 10/2008 | Moslehi ...................... 136/255 |
| 2009/0017606 A1 | 1/2009 | Fath et al. |
| 2009/0068783 A1 | 3/2009 | Borden |
| 2009/0071540 A1 | 3/2009 | Klein et al. |
| 2009/0071549 A1 | 3/2009 | Denike et al. |
| 2009/0126786 A1 | 5/2009 | Dominguez et al. |
| 2009/0142875 A1 | 6/2009 | Borden et al. |
| 2009/0227097 A1 | 9/2009 | Bateman et al. |
| 2009/0263928 A1 | 10/2009 | Tseng |
| 2009/0308440 A1 | 12/2009 | Adibi et al. |
| 2009/0308450 A1 | 12/2009 | Adibi et al. |
| 2010/0037952 A1 | 2/2010 | Lin |
| 2010/0051096 A1* | 3/2010 | Kim et al. ................... 136/256 |
| 2011/0303265 A1* | 12/2011 | Yuan et al. .................. 136/252 |

FOREIGN PATENT DOCUMENTS

| | | |
|---|---|---|
| KR | 2009-0007127 | 1/2009 |
| TW | 200945596 | 11/2009 |
| WO | WO 2009/013307 A2 | 1/2009 |

OTHER PUBLICATIONS

C. Allebe, Loic Tous et al., "An Integrated Approach for Selective Emitter Formation," 24th European Photovoltaic Solar Energy Conference, Sep. 2009, pp. 1820-1822, Germany.

Ainhoa Esturo-Breton et al., "Crystalline Si Solar Cells with Selective Emitters for Industrial Mass Production," 24th European Photovoltaic Solar Energy Conference, Sep. 2009, pp. 1068-1071, Germany.

A. Dastgheib-Shirazi et al., "Selective Emitter for Industrial Solar Cell Production: A Wet Chemical Approach Using a Single Side Diffusion Process," 23th European Photovoltaic Solar Energy Conference, 2008, pp. 1197-1199, Valencia.

* cited by examiner

US 8,987,038 B2

METHOD FOR FORMING SOLAR CELL WITH SELECTIVE EMITTERS

CROSS REFERENCE TO RELATED APPLICATIONS

This Application claims priority of Taiwan Patent Application No. 099135511, filed on Oct. 19, 2010, the entirety of which is incorporated by reference herein.

BACKGROUND

1. Technical Field

The disclosure relates generally to a solar cell and fabrication thereof, and more particularly to a solar cell with selective emitters and fabrication thereof.

2. Description of the Related Art

A solar cell with selective emitters has improved conversion efficiency. FIG. 1 is a cross section of a solar cell having a selective emitter. Referring to FIG. 1, the solar cell having a selective emitter comprises a high concentration doping region 106 in a portion of a substrate 102 under an electrode 110, a low concentration doping region 104 in the other portion of the substrate 102 outside of the electrode, and an anti-reflective layer 108 on the substrate. The solar cell has a higher open circuit voltage (Voc) and short-circuit current (Isc) than the conventional solar cell having only one doping concentration, since the low doping concentration doping emitter between the electrodes can reduce carrier recombination on the surface of the solar cell and the high concentration doping region under the electrodes can provide good electrode contacts. Therefore, the solar cell with selective emitters has high photoelectric conversion efficiency.

Since the solar cell with selective emitters has a significant advantage over the conventional solar cell having only one doping concentration, a method for forming a solar cell with selective emitters and fabrication thereof, having a simple process to form high concentration doping regions under the electrodes and low concentration doping regions in the other non-electrode regions is required.

SUMMARY

The disclosure provides a method for forming a solar cell with selective emitters, comprising, providing a substrate, forming a first texture structure on a first surface of the substrate, forming a barrier layer on the first surface of the substrate, selectively removing a portion of the barrier layer to form an opening exposing the substrate, wherein a portion of the substrate under the barrier layer is a first region and another portion of the substrate under the opening of the barrier layer is a second region, and performing a texture etching process to the second region to form a second texture structure under the opening of the barrier layer, wherein the first texture structure and the second texture structure comprise a plurality of protruding portions and recessing portions, and the distance between neighboring protruding portions of the first texture structure is $L_1$, the distance between neighboring protruding portions of the second texture structure is $L_2$, and $L_1$ is about 2~20 times that of $L_2$. The method for forming the solar cell with selective emitters further comprises removing the barrier layer, performing a doping process to the first region to form a first doping region and forming a second doping region in the second region of the substrate, and forming an electrode on the second doping region.

The disclosure further provides a solar cell with selective emitters, comprising a substrate, wherein a first region on a first surface of the substrate has a first texture structure, and a second region on the first surface of the substrate has a second texture structure, and the first texture structure and the second texture structure comprise a plurality of protruding portions and recessing portions, and the distance between neighboring protruding portions of the first texture structure is $L_1$, the distance between neighboring protruding portions of the second texture structure is $L_2$, and $L_1$ is 2~20 times that of $L_2$, a first doping region under the first region and a second doping under the second doping region, wherein a concentration of the second doping region is higher than that of the first doping region, and an electrode overlies the second region.

The disclosure yet further provides a method for forming a solar cell with selective emitter, comprising, providing a substrate, forming a first texture structure on a first surface of the substrate, doping the first surface of the substrate to form a first doping region, forming a patterned barrier in a second region on the first surface of the substrate, wherein another portion of the substrate in a first region is exposed, performing an etching process to etch the first region of the substrate uncovered by the patterned barrier layer, and removing the patterned barrier layer, and forming an electrode on the second region of the substrate.

BRIEF DESCRIPTION OF DRAWINGS

The invention can be more fully understood by reading the subsequent detailed description and examples with references made to the accompanying drawings, wherein.

DETAILED DESCRIPTION

It is understood that specific embodiments are provided as examples to teach the broader inventive concept, and one of ordinary skill in the art can easily apply the teaching of the present disclosure to other methods or apparatus. The following discussion is only used to illustrate the invention, not limit the invention.

Figure 1:
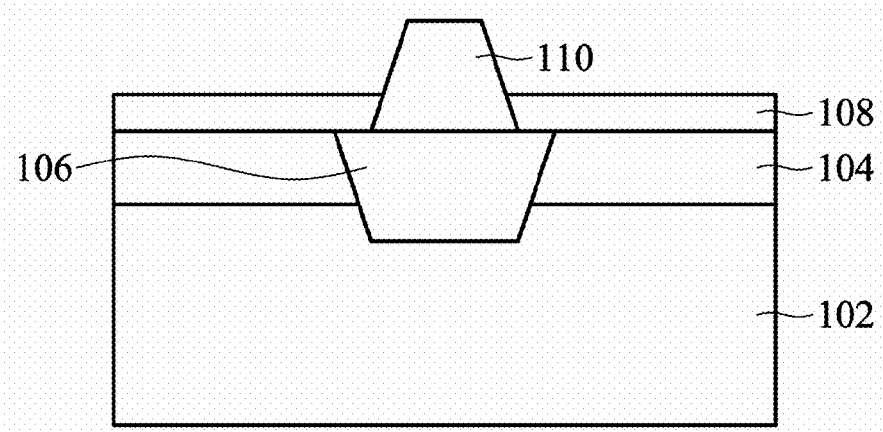
FIG. 1 is a cross section of a conventional solar cell having a selective emitter.
Figure 2:
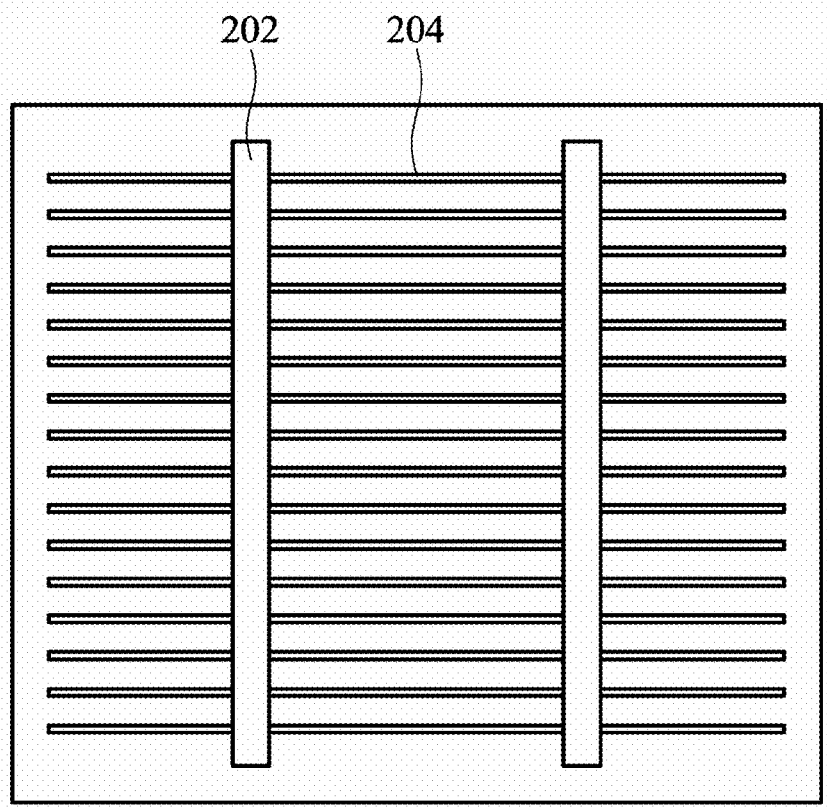
FIG. 2 is a plane view of a solar cell with selective emitter of an embodiment of the invention.

FIG. 2 is a plane view of a solar cell with selective emitter of an embodiment of the invention. Referring to FIG. 2, a plurality of electrodes 202 extends along a vertical direction, and a plurality of fingers 204 extends along a horizontal direction. The selective emitter of an embodiment of the invention is a structure comprising a high concentration doping region in portions of the substrate under the electrodes 202 and the fingers 204, and low concentration doping regions in other non-electrode regions. The invention is not limited to the structure above. The selective emitter of another embodiment can comprise high concentration doping regions merely in a portion of the substrate under the electrodes 202 and low concentration doping regions a in other non-electrode regions.

A method for forming a solar cell having selective emitters is illustrated in accordance with FIG. 3A~FIG. 3G. First, referring to FIG. 3A, a substrate 302 is provided. The substrate can be single-crystal silicon, polysilicon or other suitable semiconductor materials. Next, the substrate 302 is treated with a texturization process to form first texture structures on a first surface 304 and a second surface 306 of the substrate 302. In order to repair damage to a substrate 302 formed during cutting, a single crystal substrate generally is treated with alkaline etching, such as immersion in a NaOH solution, and a polysilicon substrate is generally treated with acid etching, such as immersion in a $HF:HNO_3:H_2O$ solution. The alkaline etching and acid etching forms first texture structures on surfaces of the substrate 302.

Figure 3A:
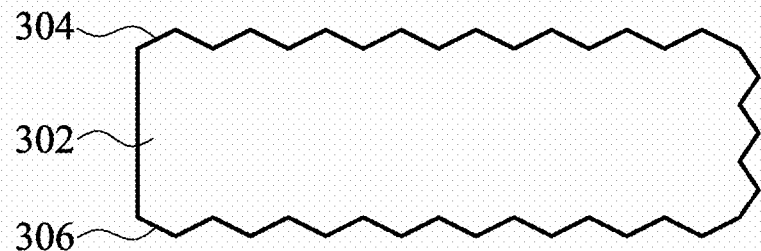
FIG. 3A~FIG. 3G are intermediate cross sections of a solar cell with selective emitter of an embodiment of the invention.
Figure 3B:
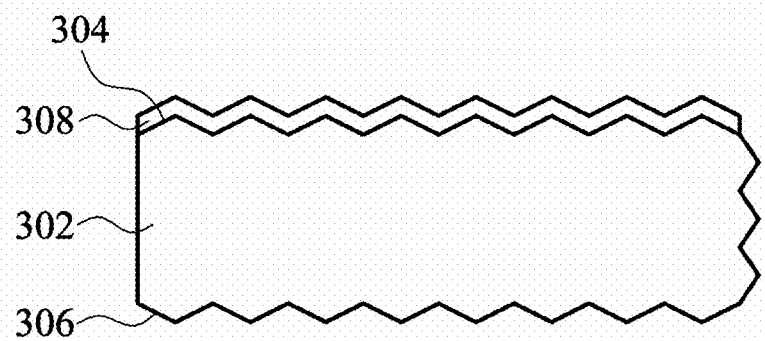
Figure 3C:
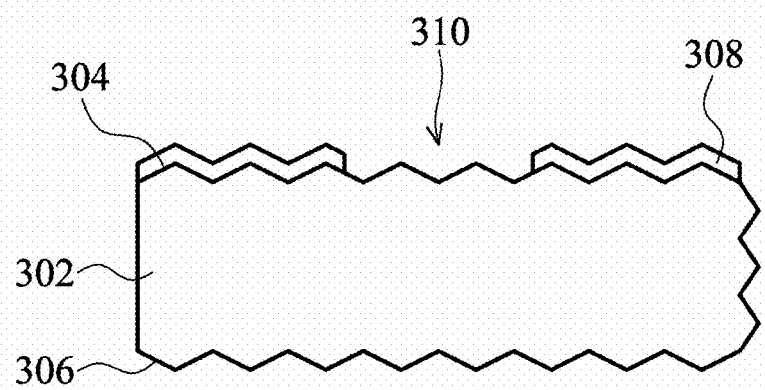
Figure 3D:
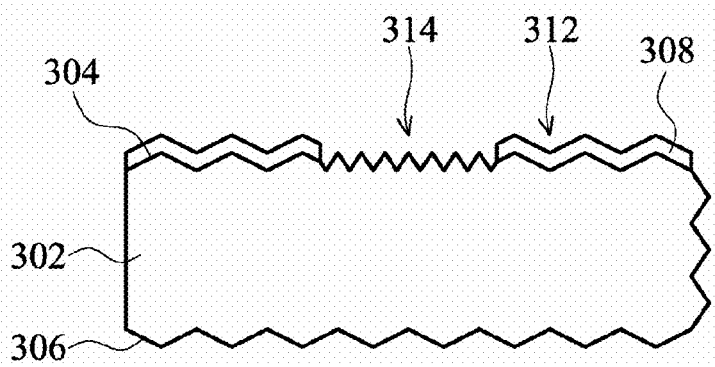
Figure 4:
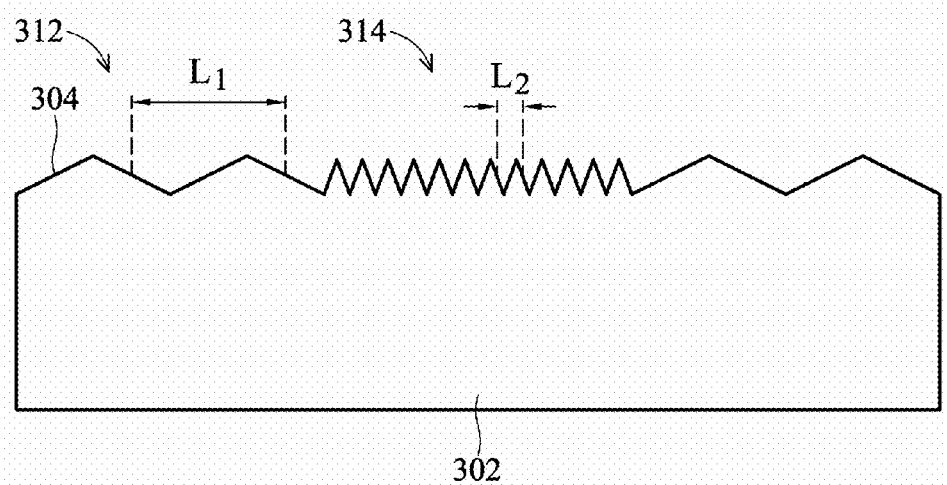
FIG. 4 is a local enlarged view of FIG. 3D.
Figure 7:
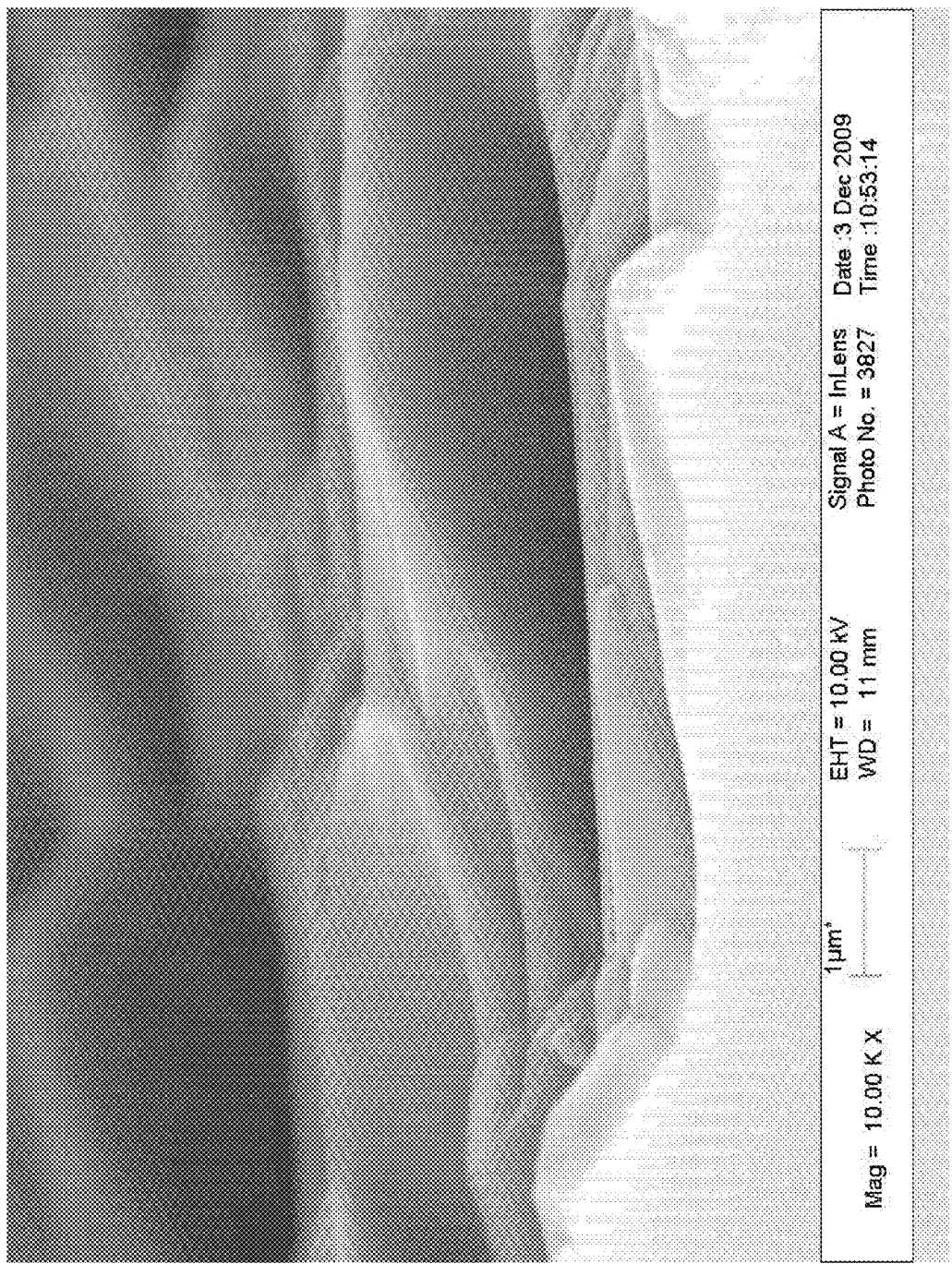
FIG. 7 is a scanning electron microscope (SEM) picture of a microtexture structure.
Figure 8:
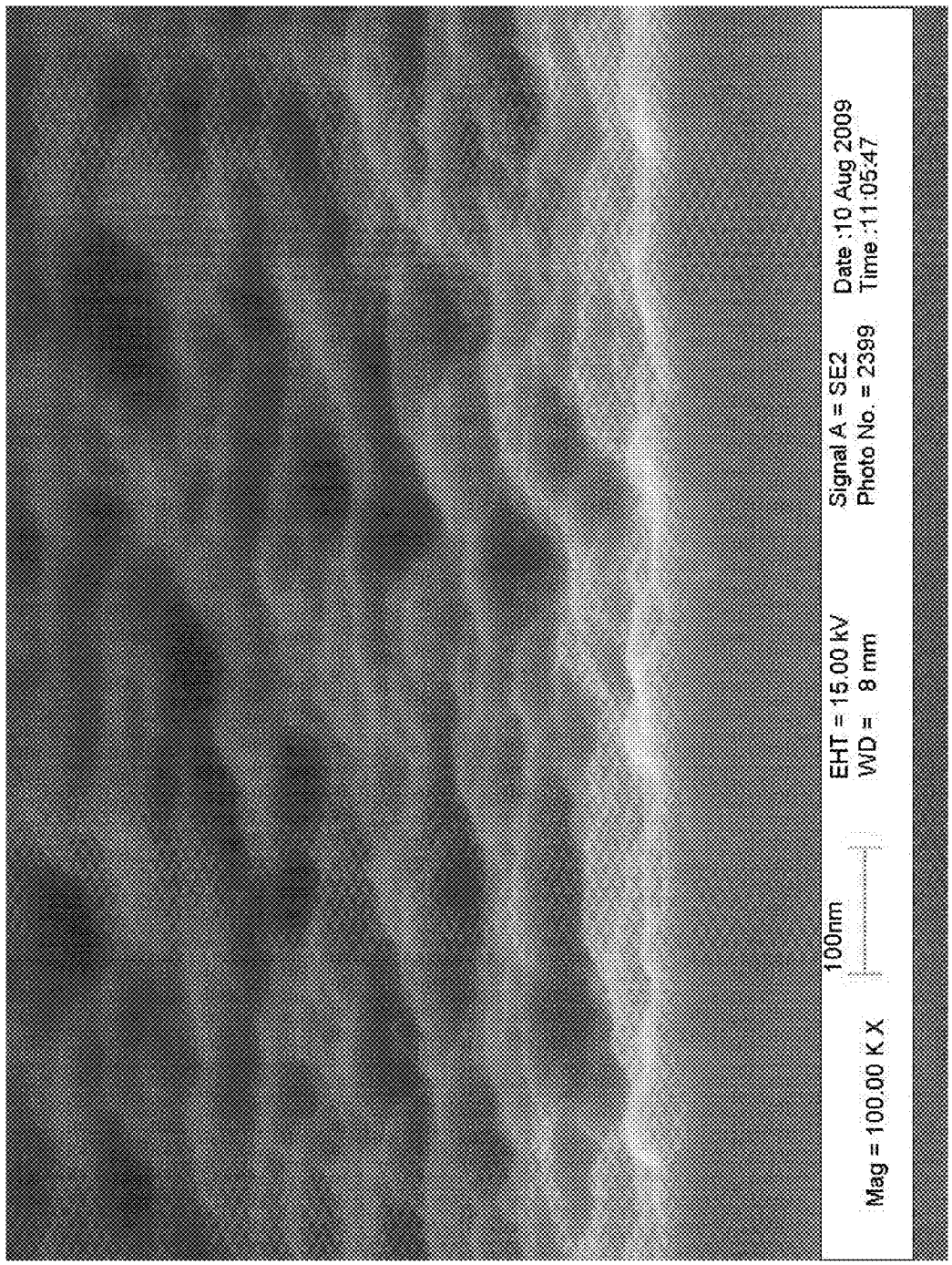
FIG. 8 is a scanning electron microscope (SEM) picture of a second texture structure.

Referring to FIG. 3B, a barrier layer 308 is formed on a first surface 304 of the substrate 302. In an embodiment of the invention, the barrier layer comprises silicon silicon oxide, silicon nitride or aluminum oxid, and can be formed by plasma enhanced chemical vapor deposition (PECVD). Referring to FIG. 3C, a portion of the barrier layer 308 at the position predetermined to form electrodes and/or fingers is selectively removed to form openings 310 exposing the substrate. In an embodiment of the invention, the step of selectively removing the barrier layer 308 can be accomplished by laser irradiation or screen printing. Thereafter, referring to FIG. 3D, a second texture etching process is performed to the portion of the substrate 302 in the opening 310 of the barrier layer 308 to form second texture structures at the region of the substrate 302 predetermined to form electrodes and/or fingers. Therefore, a first surface 304 of the substrate 302 comprises second texture structures at a second region 314 predetermined to form electrodes and/or fingers and first texture structures at a first region 312 outside of the second region 314. Next, the barrier layer 308 is removed. The barrier layer 308 can be slowly etched during the second texture etching process. The second texture structures and the first texture structures are described in more detail in accordance with FIG. 4 (local enlarged view of FIG. 3D). Referring to FIG. 4, the texture structure on the first surface 304 of the substrate 302 in the first region 312 is referred as a first texture structure, and the texture structure on the first surface 304 of the substrate 302 in the second region 314 is referred as a second texture structure. The first texture structure and the second texture structure comprise a plurality of protruding portions and recessing portions, wherein the protruding portions and recessing portions of the second texture structure are more concentrated than the protruding portions and recessing portions of the first texture structure. Specifically, the distance between neighboring protruding portions of the first texture structure is $L_1$, the distance between neighboring protruding portions of the second texture structure is $L_2$, and $L_1$ is about 2~20 times that of $L_2$. In another embodiment of the invention, $L_1$ is about 12~15 times that of $L_2$. In one embodiment of the invention, $L_1$ is about 1~10 μm. FIG. 7 shows a scanning electron microscope (SEM) picture of a first texture structure. FIG. 8 shows a scanning electron microscope (SEM) picture of a second texture structure. Referring to FIG. 7 and FIG. 8, the distance between neighboring protruding portions of the first texture structure $L_1$ is at least larger than two times that of the distance between neighboring protruding portions of the second texture structure $L_2$.

In an embodiment of the invention, the second texture etching described comprises the steps as follows. First, an electroless deposition process is performed to form silver particles on a first surface 304 of the substrate 302, acting as a catalytic agent. Next, a black etching process, such as immersing the substrate in $HF:H_2O_2:H_2O$, is performed. Note that US 20090311821A1 is incorporated by reference to illustrate the details of the second texture etching process. It is also noted that the second texture etching process of the invention is not limited to the etching process described, and any method which can form a second texture structure can be applied in the invention.

Figure 3E:
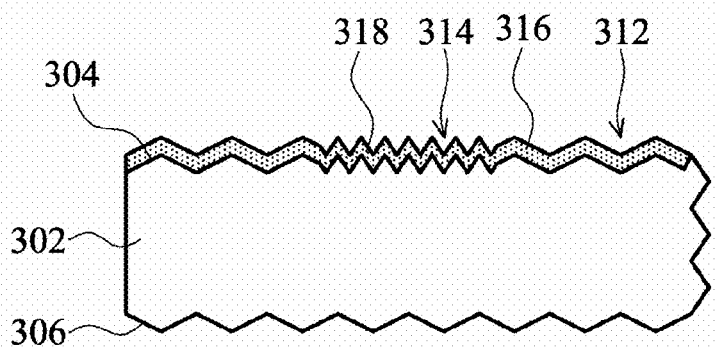

Thereafter, referring to FIG. 3E, a doping process is performed to form a first doping region 316 in a first region 312 on the first surface 304 of the substrate 302, and a second doping region 318 in a second region 314 on the first surface 304 of the substrate 302. In an embodiment of the invention, the doping process uses $POCl_3$ as a doping source. In another embodiment of the invention, the doping process uses boron as a doping source. The difference in sheet resistance between the first doping region 316 and the second doping region 318 is illustrated in accordance with table 1.

TABLE 1

| | Sheet resistance (Ω/sq) | Sheet resistance (Ω/sq) | Sheet resistance (Ω/sq) |
|---|---|---|---|
| Target resistance | 70 | 80 | 100 |
| Reference (first texture structure) | 71 | 81 | 102 |
| Second texture structure | 37 | 43 | 85 |
| Difference (Ω/sq) | 34 | 38 | 17 |

The first table shows that the second texture structure on the surface of the substrate 302 has a relatively lower sheet resistance (i.e. higher doping concentration) and the micro-texture structure in the first region 312 on the surface of the substrate 302 has a relatively higher sheet resistance after the phosphorous diffusing process. Accordingly, the doping process can form a second doping region 318 having a relatively high doping concentration at the second region 314 and form a first doping region 316 having a relatively low doping concentration at the first region 312. It is noted that the embodiment of the invention can form doping regions (first doping region 316 and second doping region 318) having different doping concentrations during a single doping step. The method of the embodiment of the invention has less process duration and costs than conventional methods of fabricating selective emitters of a solar cell. Next, the phosphorous silicon glass (PSG) on the surface of the substrate 302 is removed.

Figure 3F:
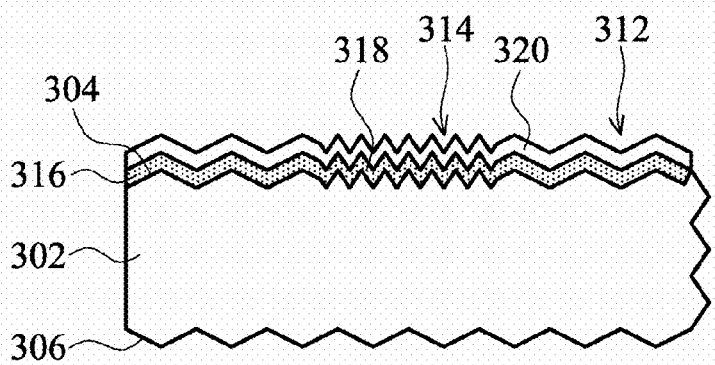
Figure 3G:
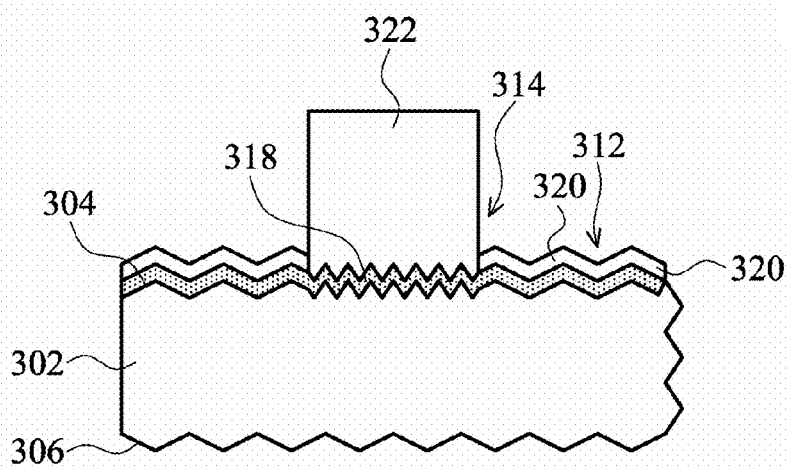
Figure 9:
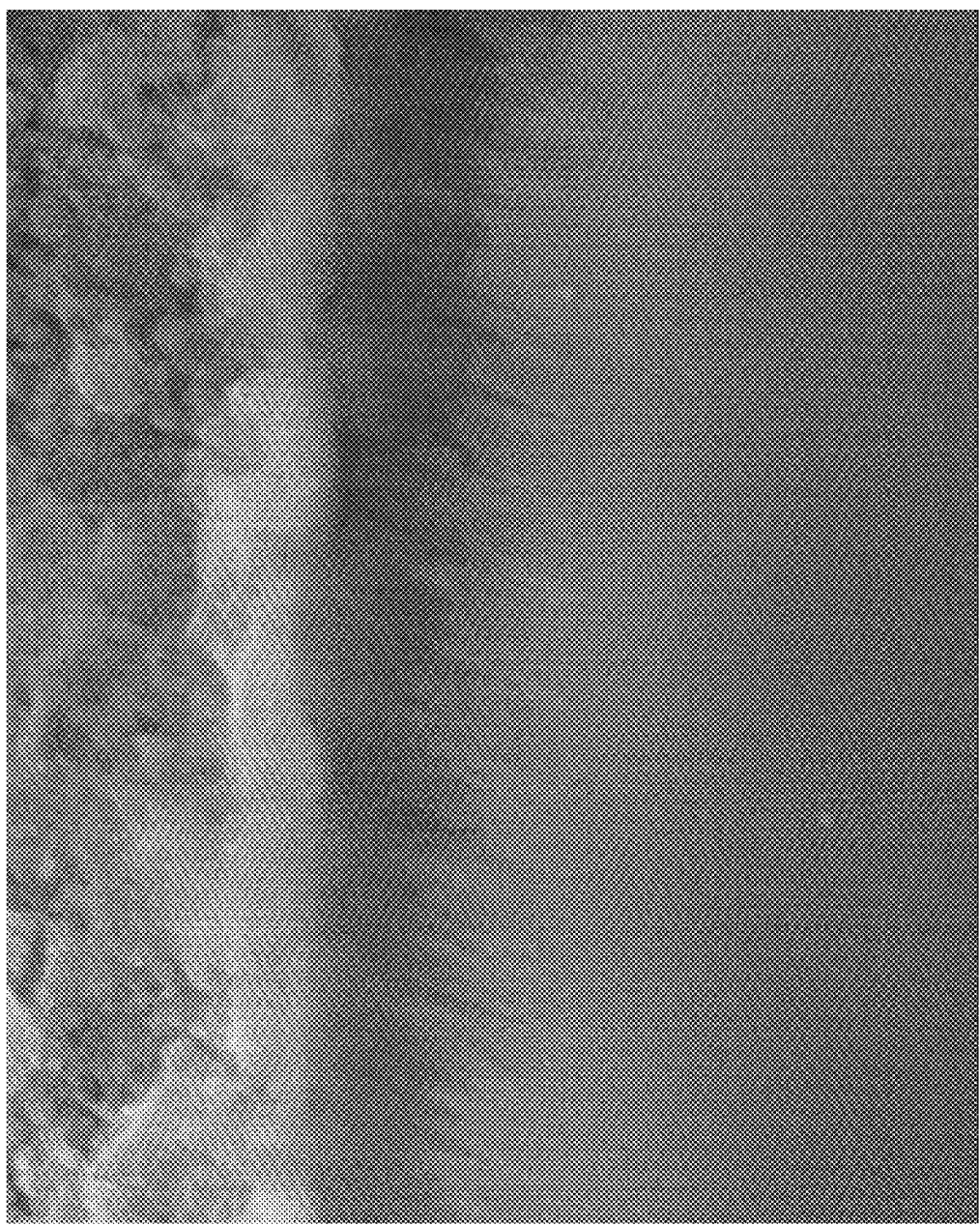
FIG. 9 is a scanning electron microscope (SEM) picture of an interface between an electrode and the second region of the substrate treated with second texture etching.

Following, referring to FIG. 3F, an anti-reflective layer 320 is formed on the first surface 304 of the substrate 302. In an embodiment of the invention, the anti-reflective layer 320 comprises silicon oxide, silicon nitride or aluminum oxid, and can be formed by plasma enhanced chemical vapor deposition (PECVD). Referring to FIG. 3G, a screen printing and a sintering metallization process are performed to form electrodes 322 contacting the second doping region 318 in the second region 314. FIG. 9 shows a scanning electron microscope (SEM) picture of an interface between an electrode 322 and the second region 314 of the substrate 302 treated with second texture etching. Last, an edge isolating process is performed by laser irradiation (not shown).

Example 1

First, a wafer was provided. The wafer was treated with a standard cleaning process wherein a texture structure was formed on a surface of the wafer. A silicon nitride was formed on a surface of the wafer by plasma enhanced chemical vapor deposition (PECVD) to act as a barrier layer. Next, the barrier layer was selectively removed by laser patterning to form openings having similar shapes with a metallization pattern. An immersing alkaline solution process was performed to remove defects on the surface of the wafer caused by laser patterning. A second texture etching process including the following two steps was performed. The first step included performing an electroless treatment, wherein $Na_2S_2O_8$ was used as an oxidizer, and $AgNO_3$, $H_2O_2$ or $NaOH$ was used as a catalytic agent. The second step included performing selective oxidizing and removing processes by using a solution containing HF and $H_2O_2$ to form a second texture surface. Both the first and second steps were performed at room temperature, and water based chemistries were used. During the second texture wet chemical treating process, the silicon nitride barrier layer was slowly removed.

Next, the wafer was cleaned using concentrated $HNO_3$ and HPM solutions. A single $POCl_3$ diffusing process was performed to form emitter, wherein the standard texture structure had sheet resistance of about 60-80 Ω/sq (for example 70 Ω/sq), and the second texture structure had a sheet resistance of about 15-50 Ω/sq (for example 30 Ω/sq), thereby forming selective emitter. Next, a PECVD process was performed to form a silicon nitride layer, which acted as an anti-reflective layer. A screen printing process was performed to form a silver electrode at the front side and aluminum back surface field (BSF) on the rear side of the substrate. Thereafter, a co-firing step was performed. Lastly, an edge isolating process was performed by laser irradiation. A solar cell with selective emitter formed by the method above was measured, and had a cell efficiency of 16.01%. A comparable example of a solar cell without selective emitter being formed was also measured, and had a cell efficiency of 15.51%. Therefore, the technique of the embodiment indeed increased cell efficiency of the solar cells.

Figure 5A:
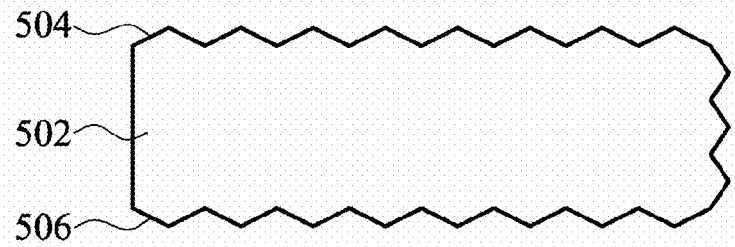
FIG. 5A~FIG. 5F are intermediate cross sections of a solar sell with selective emitters of another embodiment of the invention.
Figure 5B:
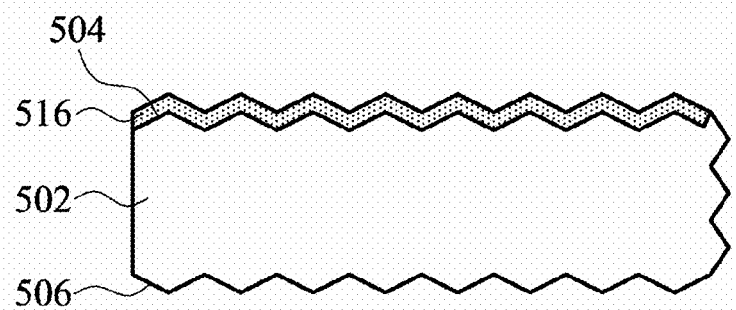
Figure 5C:
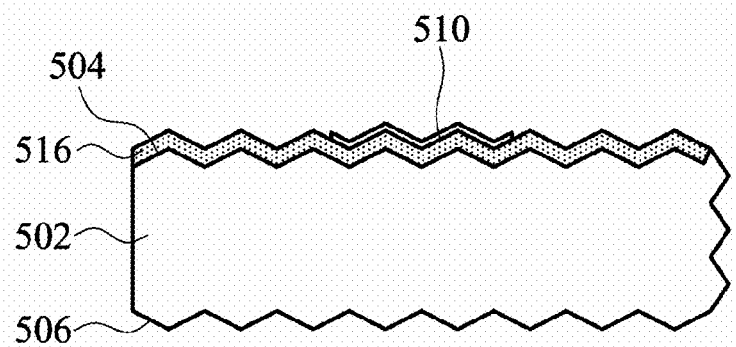
Figure 5D:
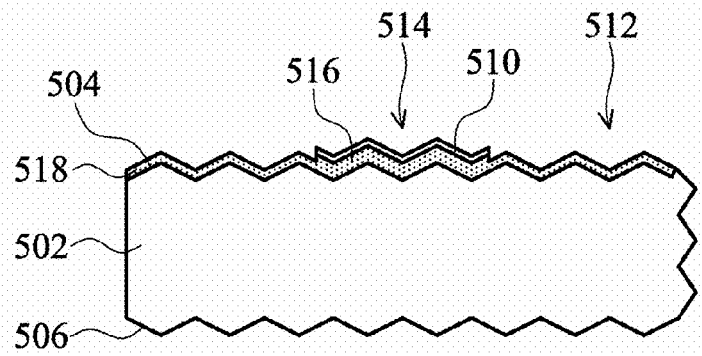
Figure 5E:
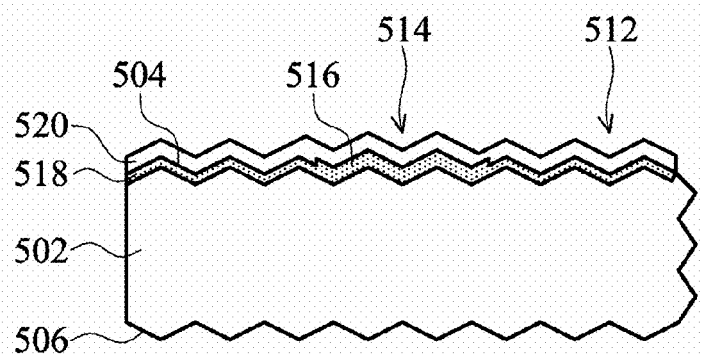

A method for forming a solar cell having selective emitter of another embodiment of the invention is illustrated in accordance with FIG. 5A–FIG. 5F. First, referring to FIG. 5A, a substrate 502 is provided. The substrate 502 can be made of a single-crystal silicon, polysilicon or other suitable semiconductor materials. Next, the substrate 502 is treated with a texturization process to form first texture structures on a first surface 504 and a second surface 506 thereof. In order to repair damage to a substrate 502 formed during cutting, a single crystal substrate is generally treated with alkaline etching, such as immersion in a NaOH solution, and a polysilicon substrate 502 is generally treated with acid etching, such as immersion in a $HF:HNO_3:H_2O$ solution. The alkaline etching and acid etching processes form first texture structures on surfaces of the substrate 502. Referring to FIG. 5B, a doping process is performed to form a high doping concentration region 516 on a first surface 504 of the substrate 502. In an embodiment of the invention, the doping process uses $POCl_3$ as a doping source. Next, the phosphorous silicon glass (PSG) on the surface of the substrate 502 is removed. Referring to FIG. 5C, a patterned barrier layer 510 having similar shapes with the electrode pattern is formed on the first surface 504 of the substrate 502 by, for example screen printing. Thereafter, referring to FIG. 5D, an etching back process is performed to selectively etch a portion of the substrate 502 surface not covered by patterned barrier layer 510, thereby forming a low concentration doping region 518 in a first region 512 not covered by the patterned barrier layer 510, and a high concentration doping region 516 in a second region 514 covered by the patterned barrier layer 510.

Figure 6A:
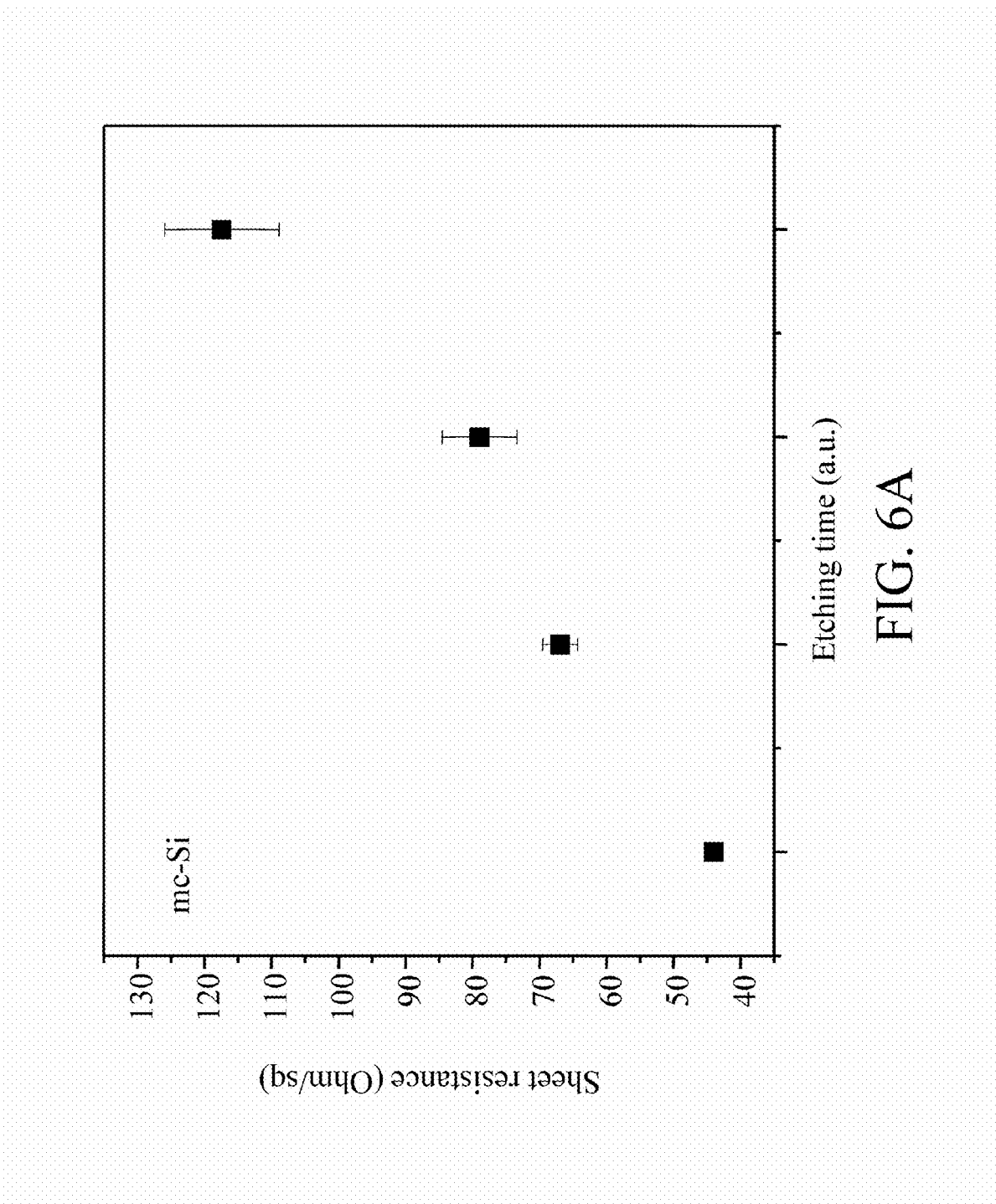
FIG. 6A is a diagram of a doped multicrystalline silicon substrate with sheet resistance as a function of the etching time.
Figure 6B:
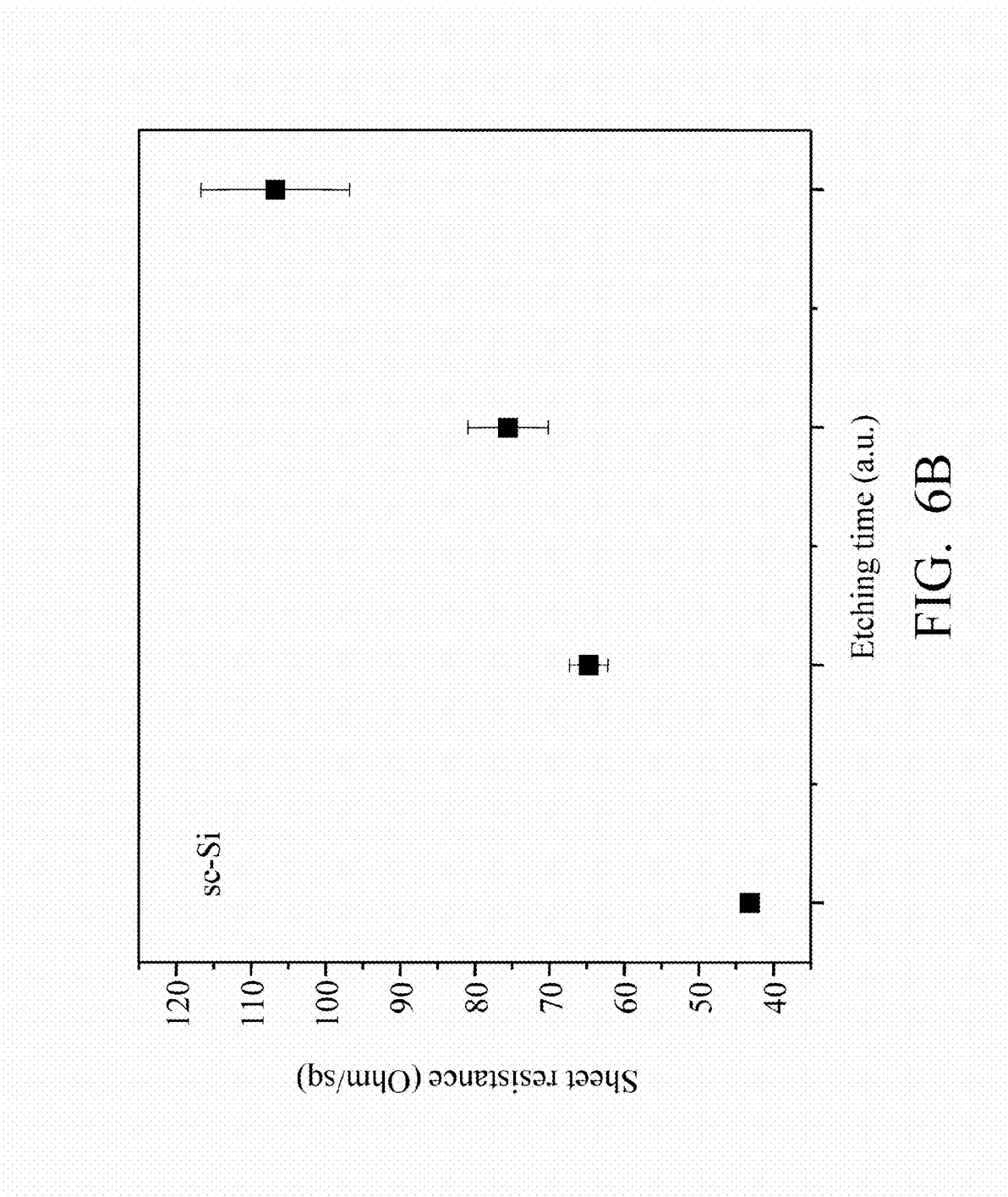
FIG. 6B is a diagram of a doped single-crystal silicon substrate with sheet resistance as a function of the etching time.

The mechanism of forming the high concentration doping region and the low concentration doping region is illustrated in accordance with FIG. 6A and FIG. 6B. The doping process forms a high concentration doping region on the substrate surface. The deeper the etching of the substrate, the lesser the doping concentration. FIG. 6A shows a diagram of a doped multicrystalline silicon substrate with sheet resistance as a function of etching time. Referring to FIG. 6A, the longer the etching time, the higher the sheet resistance of the substrate. That is, when the etching depth is increased, the doping concentration of the substrate is reduced. FIG. 6B shows a diagram of a doped single-crystal silicon substrate with sheet resistance as a function of etching time. The result shown in FIG. 6B is similar to that shown in FIG. 6A. Therefore, the embodiment can form a low concentration doping region 518 in the first region 512 of the substrate 502 uncovered by the patterned barrier layer 510, while, have the unetched second region 514 covered by the patterned barrier layer 510 not changed from the high concentration doping region 516, thereby forming selective emitter. In an embodiment of the invention, the etching back process described is accomplished by a second texture etching process. Because the second texture etching process has low etching rate, the etching depth can be precisely controlled. The second texture etching process comprises the steps as follows. First, an electroless deposition process is performed to form silver particles on a first surface 504 of the substrate 502 acting as a catalytic agent. Next, a black etching process, such as immersion in $HF:H_2O_2:H_2O$, is performed. US 20090311821A1 is incorporated by reference to illustrate the details of the second texture etching process.

Figure 5F:
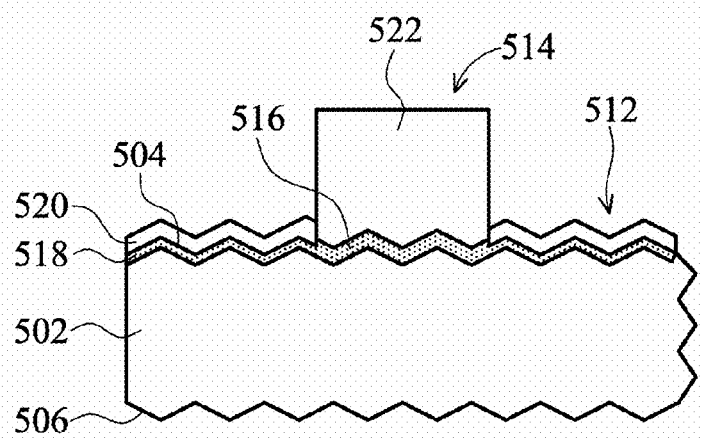

Thereafter, the phosphorous silicon glass (PSG) on the surface of the substrate 502 is removed. Next, referring to FIG. 5E, an anti-reflective layer 520 is formed on the first surface 504 of the substrate 502. In an embodiment of the invention, the anti-reflective layer 520 comprises silicon nitride, and can be formed by plasma enhanced chemical vapor deposition (PECVD). Referring to FIG. 5F, a screen printing and a sintering metallization process are performed to form electrodes 522 contacting the high concentration doping region 516 in the second region 514. Last, an edge isolating process is performed by laser irradiation (not shown).

Example 2

First, a wafer was provided. The wafer was treated with a standard cleaning process wherein a texture structure was formed on a surface of the wafer. A single $POCl_3$ diffusing process was performed and the doped substrate surface had a sheet resistance of about 45 Ω/sq. A patterned barrier layer, having similar shapes with an electrode pattern, was formed on the surface of the substrate by screen printing. A portion of the substrate uncovered by the patterned barrier layer was etched by second texture etching. The second texture etching process comprised the two steps as follows. The first step included performing an electroless treatment, wherein $Na_2S_2O_8$ was used as an oxidizer, and $AgNO_3$, $H_2O_2$ or NaOH was used as a catalytic agent. The second step included performing selective oxidizing and removing processes by using a solution containing HF and $H_2O_2$ to form second texture structures on the surface of the substrate. The duration of the second-etching back process was about 60 sec, and the etching process substantially removed 50~70 nm of the doping region of the substrate. The etched substrate had high sheet resistance (i.e. lower doping concentration) and the unetched substrate surface had low sheet resistance (i.e. higher doping concentration) on surfaces thereof. Therefore, selective emitters can be formed. Next, the patterned barrier was removed. Next, a PECVD process was performed to form a silicon nitride layer, which acted as a passivated and anti-reflective layer. A screen printing process was performed to form a silver electrode at the front side of the substrate. Thereafter, a co-firing step was performed. Lastly, an edge isolating process was performed by laser irradiation.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a solar cell with selective emitters, comprising:
    providing a substrate;
    forming a first texture structure on a first surface of the substrate;
    forming a barrier layer on the first surface of the substrate;
    selectively removing a portion of the barrier layer to form an opening exposing the substrate, wherein a portion of the substrate under the barrier layer is a first region and another portion of the substrate under the opening of the barrier layer is a second region;
    performing a second texture etching process to the substrate to form a second texture structure in the second region under the opening of the barrier layer, wherein the first texture structure and the second texture structure comprise a plurality of protruding portions and recessing portions, and the distance between neighboring protruding portions of the first texture structure is $L_1$, the distance between neighboring protruding portions of the second texture structure is $L_2$, and $L_1$ is about 2~20 times that of $L_2$, wherein the second texture etching process comprises performing a selective oxidizing electroless treatment and performing oxidation products removing steps;
    removing the barrier layer;
    performing a doping process to the substrate to form a first doping region in the first region and form a second doping region in the second region of the substrate; and
    forming an electrode on the second doping region.

2. The method for forming a solar cell with selective emitter as claimed in claim 1, wherein a doping concentration of the second doping region is higher than that of the first doping region.

3. The method for forming a solar cell with selective emitter as claimed in claim 1, further comprising forming an anti-reflective layer on the substrate surface before forming the electrode.

4. The method for forming a solar cell with selective emitter as claimed in claim 3, wherein the barrier layer and the anti-reflective layer are formed of silicon oxide silicon nitride or aluminum oxide.

5. The method for forming a solar cell with selective emitter as claimed in claim 1, wherein the doping process dopes phosphorous or boron.

6. The method for forming a solar cell with selective emitters as claimed in claim 1, wherein $N_2S_2O_8$ is used as an oxidizer, and $AgNO_3$, $H_2O_2$ or NaOH is used as a catalytic agent in the electroless treatment process and the selective oxidizing products removing step is performed in a solution containing HF and $H_2O_2$.

7. The method for forming a solar cell with selective emitters as claimed in claim 1, wherein $L_1$ is about 1~10 μm.

8. The method for forming a solar cell with selective emitters as claimed in claim 1, wherein $L_1$ is about 12~15 times that of $L_2$.

* * * * *